United States Patent
Kretman

(10) Patent No.: US 7,778,033 B2
(45) Date of Patent: Aug. 17, 2010

(54) THERMALLY CONDUCTIVE COVERS FOR ELECTRIC CIRCUIT ASSEMBLIES

(75) Inventor: Matthew D. Kretman, Maplewood, MO (US)

(73) Assignee: Astec International Limited, Kwun Tong, Kowloon (HK)

( * ) Notice: Subject to any disclaimer, the term of this patent is extended or adjusted under 35 U.S.C. 154(b) by 49 days.

(21) Appl. No.: 12/261,803

(22) Filed: Oct. 30, 2008

(65) Prior Publication Data

US 2010/0110640 A1  May 6, 2010

(51) Int. Cl.
*H05K 7/20* (2006.01)
*F28F 7/00* (2006.01)

(52) U.S. Cl. .................. 361/703; 165/80.2; 165/185; 361/704; 361/715

(58) Field of Classification Search .......... 361/703, 361/715
See application file for complete search history.

(56) References Cited

U.S. PATENT DOCUMENTS

| | | | | |
|---|---|---|---|---|
| 4,899,256 A | * | 2/1990 | Sway-Tin | 361/715 |
| 4,922,376 A | * | 5/1990 | Pommer et al. | 361/715 |
| 5,402,313 A | * | 3/1995 | Casperson et al. | 361/710 |
| 5,761,047 A | | 6/1998 | Settles et al. | |
| 5,812,375 A | * | 9/1998 | Casperson | 361/707 |
| 5,909,819 A | | 6/1999 | Adachi et al. | |
| 5,930,113 A | * | 7/1999 | McCann | 361/704 |
| 6,055,158 A | | 4/2000 | Pavlovic | |
| 6,065,530 A | * | 5/2000 | Austin et al. | 165/80.3 |
| 6,185,100 B1 | * | 2/2001 | Bentz et al. | 361/704 |
| 6,466,441 B1 | * | 10/2002 | Suzuki | 361/695 |
| 6,487,073 B2 | | 11/2002 | McCullough et al. | |
| 6,867,972 B2 | * | 3/2005 | Franke | 361/697 |
| 7,336,491 B2 | * | 2/2008 | Goemmel et al. | 361/707 |
| 7,606,027 B2 | * | 10/2009 | Takasou | 361/695 |

* cited by examiner

*Primary Examiner*—Gregory D Thompson
(74) *Attorney, Agent, or Firm*—Harness, Dickey & Pierce, P.L.C.

(57) ABSTRACT

A method of producing a thermally conductive cover for an electric circuit assembly having a plurality of heat dissipating components is disclosed. The thermally conductive cover including a top surface, a bottom surface, and at least one rib extending downwardly from the bottom surface. The method includes selecting a plurality of dimensions for the thermally conductive cover such that the bottom surface will be spaced above and extend over top sides of the plurality of heat dissipating components when the thermally conductive cover is installed over the electronic circuit assembly. The at least one rib will extend over and be spaced from the plurality of heat dissipating components when the thermally conductive cover is installed over the electronic circuit assembly. The method further includes producing the thermally conductive cover with the selected dimensions. Thermally conductive covers are also disclosed.

24 Claims, 13 Drawing Sheets

US 7,778,033 B2

THERMALLY CONDUCTIVE COVERS FOR ELECTRIC CIRCUIT ASSEMBLIES

FIELD

The present disclosure relates to thermally conductive covers for electric circuit assemblies having heat generating components mounted thereon.

BACKGROUND

The statements in this section merely provide background information related to the present disclosure and may not constitute prior art.

Cases are often used to enclose and protect circuit boards and the components installed on the circuit boards. These circuit boards often include components that generate heat when the circuit is operating. The heat generated by such components is generally contained by the case and may be transferred to the circuit board within the case and to other components mounted on the circuit board.

SUMMARY

This section provides a general summary of the disclosure, and is not a comprehensive disclosure of its full scope or all of its features.

According to one aspect of the present disclosure, a method of producing a thermally conductive cover for an electric circuit assembly having a plurality of heat dissipating components is disclosed. The thermally conductive cover includes a top surface, a bottom surface, and at least one rib extending downwardly from the bottom surface. The method includes selecting a plurality of dimensions for the thermally conductive cover such that the bottom surface will be spaced above and extend over top sides of the plurality of heat dissipating components and the at least one rib will extend over and be spaced from the plurality of heat dissipating components when the thermally conductive cover is installed over the electronic circuit assembly. The method further includes producing the thermally conductive cover with the selected dimensions.

According to another aspect of the present disclosure, an electronic circuit assembly includes a plurality of heat dissipating components and each component has a top side. The assembly further includes a thermally conductive cover having a top surface, a bottom surface, and at least one rib extending downwardly from the bottom surface. The bottom surface is spaced above and extends over the top sides of the plurality of heat dissipating components. The at least one rib extends over and is spaced from the plurality of heat dissipating components.

According to yet another aspect of the present disclosure an improvement to a method of using a power supply module is disclosed. The method includes producing a first maximum output current. The first maximum output current is thermally limited due to one or more heat dissipating components in the power supply module. The improvement to the method includes installing a thermally conductive cover over the power supply module. The thermally conductive cover includes a bottom surface spaced above and extending over top sides of the plurality of heat dissipating components. The thermally conductive cover also includes producing a second maximum output current that is greater than the first maximum output current with the thermally conductive cover installed over the power supply module.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Corresponding reference numerals indicate corresponding parts throughout the several views of the drawings.

DETAILED DESCRIPTION

Figure 1:
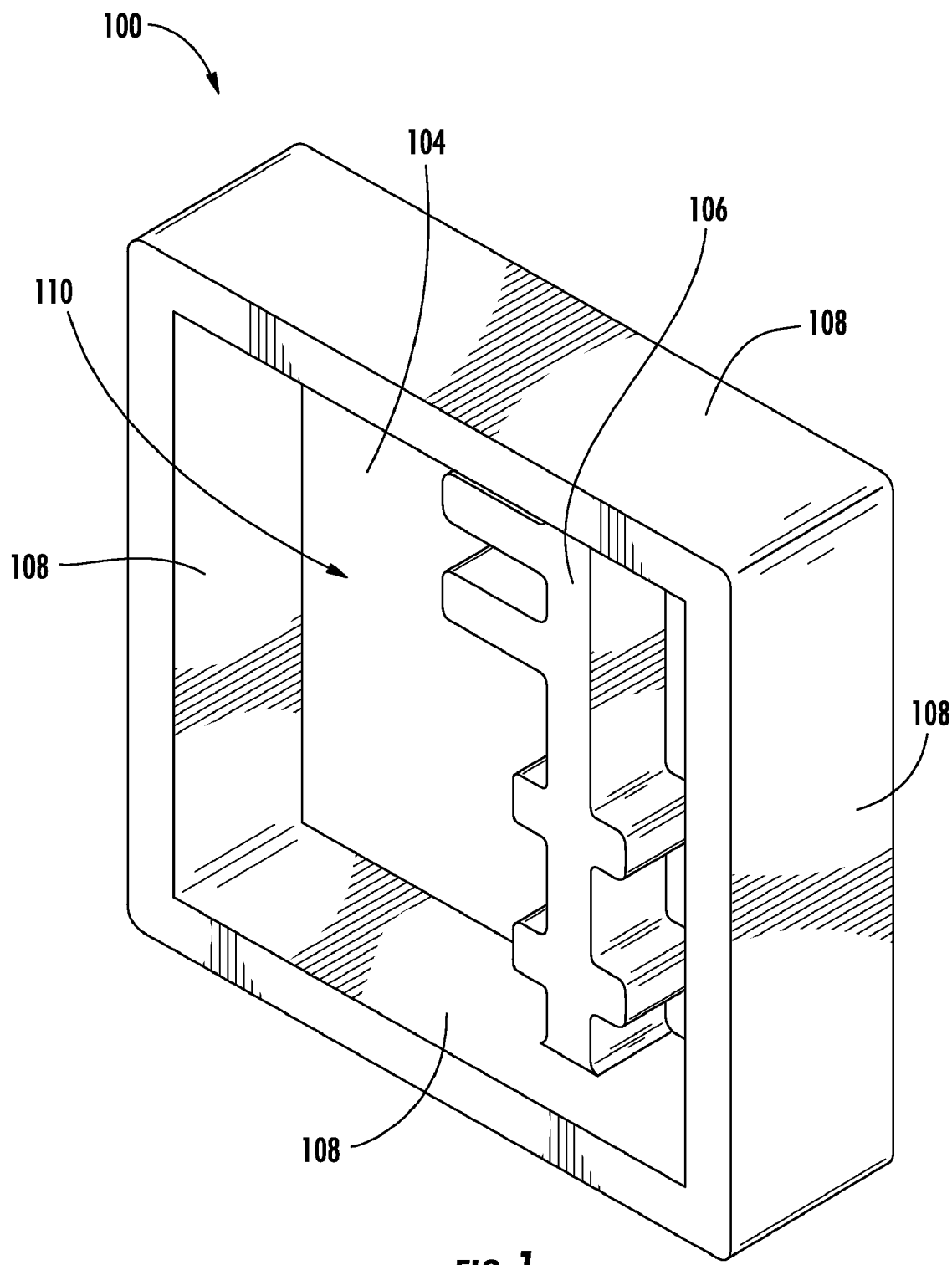
FIG. 1 is a bottom isometric view of a thermally conductive case for a circuit board having heat generating components.
Figure 2:
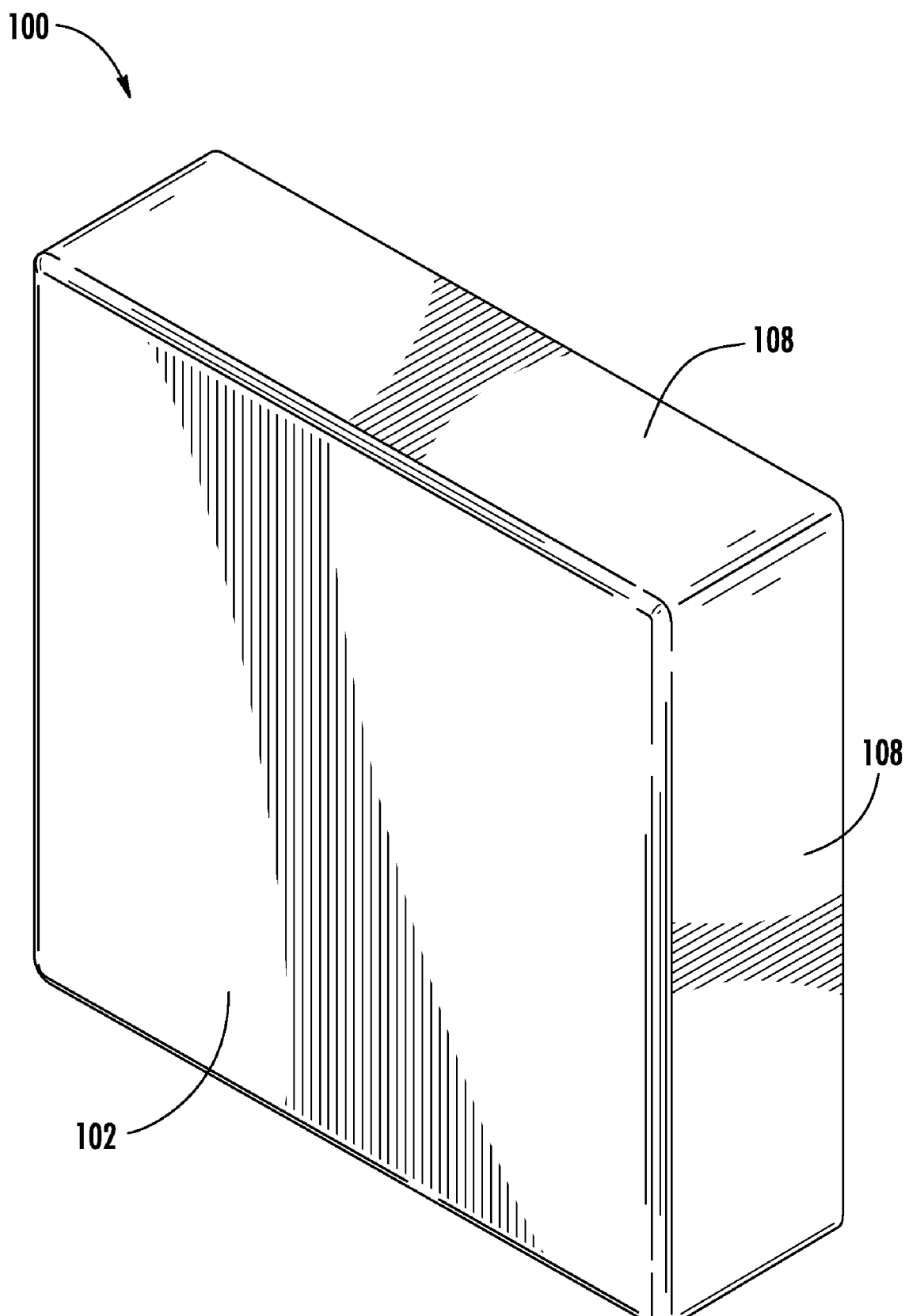
FIG. 2 is a top isometric view the case in FIG. 1.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to one aspect of the present disclosure, a method of producing a thermally conductive cover for an electric circuit assembly having a plurality of heat dissipating components is disclosed. The thermally conductive cover includes a top surface, a bottom surface, and at least one rib extending downwardly from the bottom surface. The method includes selecting a plurality of dimensions for the thermally conductive cover such that the bottom surface will be spaced above and extend over top sides of the plurality of heat dissipating components and the at least one rib will extend over and be spaced from the plurality of heat dissipating components when the thermally conductive cover is installed over the electronic circuit assembly. The method further includes producing the thermally conductive cover with the selected dimensions.

According to another aspect of the present disclosure, an electronic circuit assembly includes a plurality of heat dissipating components and each component has a top side. The assembly further includes a thermally conductive cover having a top surface, a bottom surface, and at least one rib extending downwardly from the bottom surface. The bottom surface is spaced above and extends over the top sides of the plurality of heat dissipating components. The at least one rib extends over and is spaced from the plurality of heat dissipating components.

According to yet another aspect of the present disclosure an improvement to a method of using a power supply module is disclosed. The method includes producing a first maximum output current. The first maximum output current is thermally limited due to one or more heat dissipating components in the power supply module. The improvement to the method includes installing a thermally conductive cover over the power supply module. The thermally conductive cover includes a bottom surface spaced above and extending over top sides of the plurality of heat dissipating components. The thermally conductive cover also includes producing a second maximum output current that is greater than the first maximum output current with the thermally conductive cover installed over the power supply module.

One example of a thermally conductive cover suitable for one or more of the aforementioned aspects and assemblies including such a cover will be described with reference to FIGS. 1-7.

A thermally conductive cover for a circuit board having a heat generating component, such as a switch, transistor, resistor, inductor, a controller for a transistor, etc., mounted thereon is generally indicated by reference numeral 100 in FIGS. 1-7. The cover 100 includes a top surface 102, a bottom surface 104, and at least one rib 106 extending downwardly from the bottom surface 104. The cover 100 is configured such that the bottom surface 104 will be spaced above and extend over the top sides of the plurality of heat dissipating components when the cover 100 is placed over the circuit board. The at least one rib 106 is oriented to extend over and be spaced from the plurality of heat dissipating components when the cover 100 is placed over the circuit board.

The cover 100 also includes four sides 108. The top 102 and the sides 108 define an internal cavity 110. Although the figures illustrate four sides 108, all approximately the same size, the cover may include more or fewer sides 108 and the sides 108 need not all be the same size. The rib 106, or protrusion, is contained within the internal cavity 110. The rib 106 depends down from the top 102 in a direction generally perpendicular to the plane of the top 102 and is connected to two of the sides 108 and the top 102. The rib 106 may also be connected to more or fewer, including none, of the sides 108.

The cover 100 is made of a thermally conductive material. While the cover 100 may be any thermally conductive material, including metal, the example cover 100 made of thermally conductive plastic. The plastic is a polymer resin. The polymer resin may be filled with thermally conductive fillers. In some embodiments, the plastic is a polyplenylene sulfide (PPS) polymer resin to which thermally conductive fillers, such as carbon fiber and/or carbon powder have been added. However, any suitable thermally conductive plastic, with or without fillers, can be used. The cover 100 is monolithically, or integrally, formed of the thermally conductive plastic. The cover 100 may be formed by injection molding or other methods of manufacturing a monolithically formed cover 100.

Figure 5:
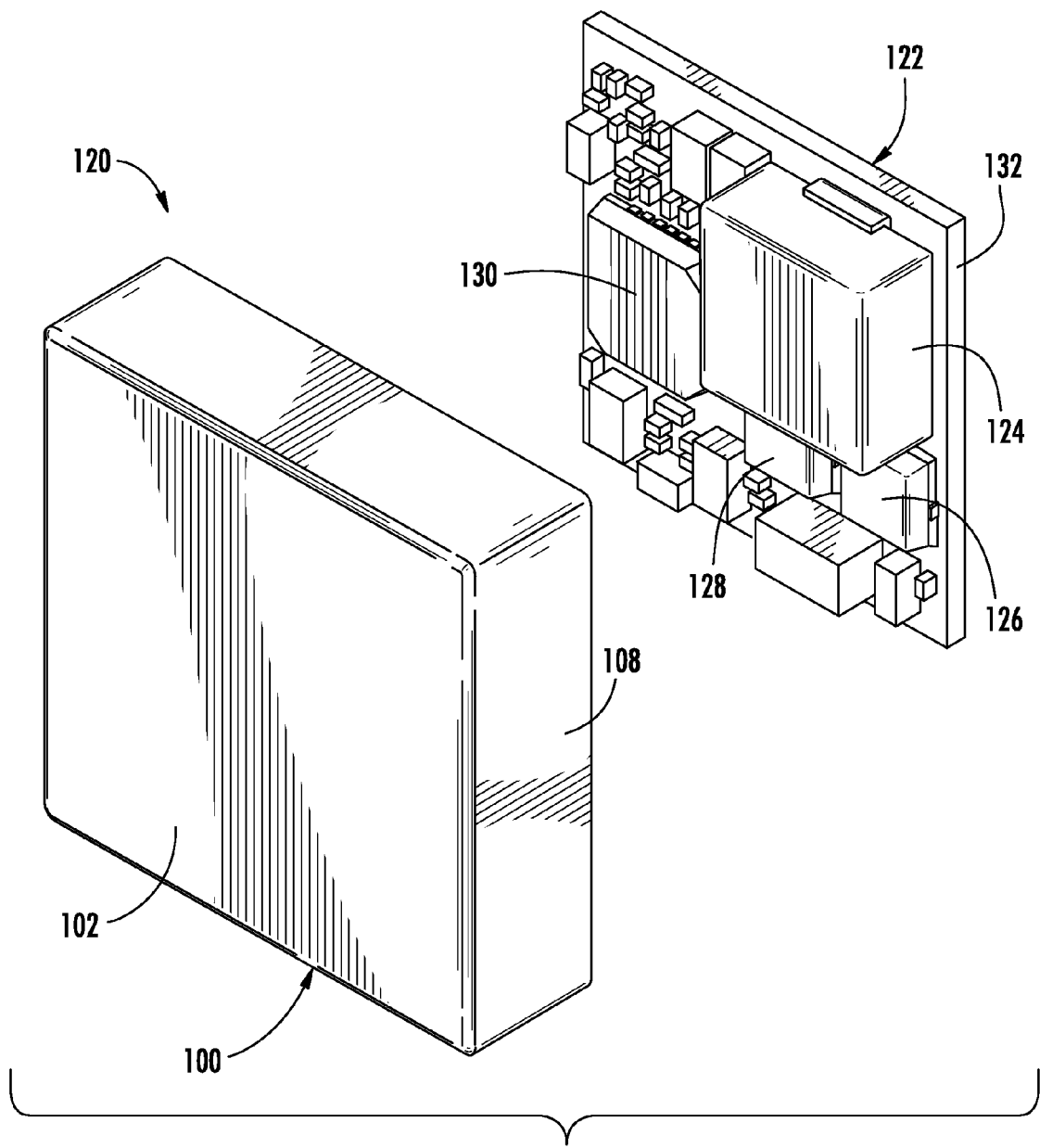
FIG. 5 is a top exploded isometric view of a circuit assembly including the case in FIG. 1.
Figure 6:
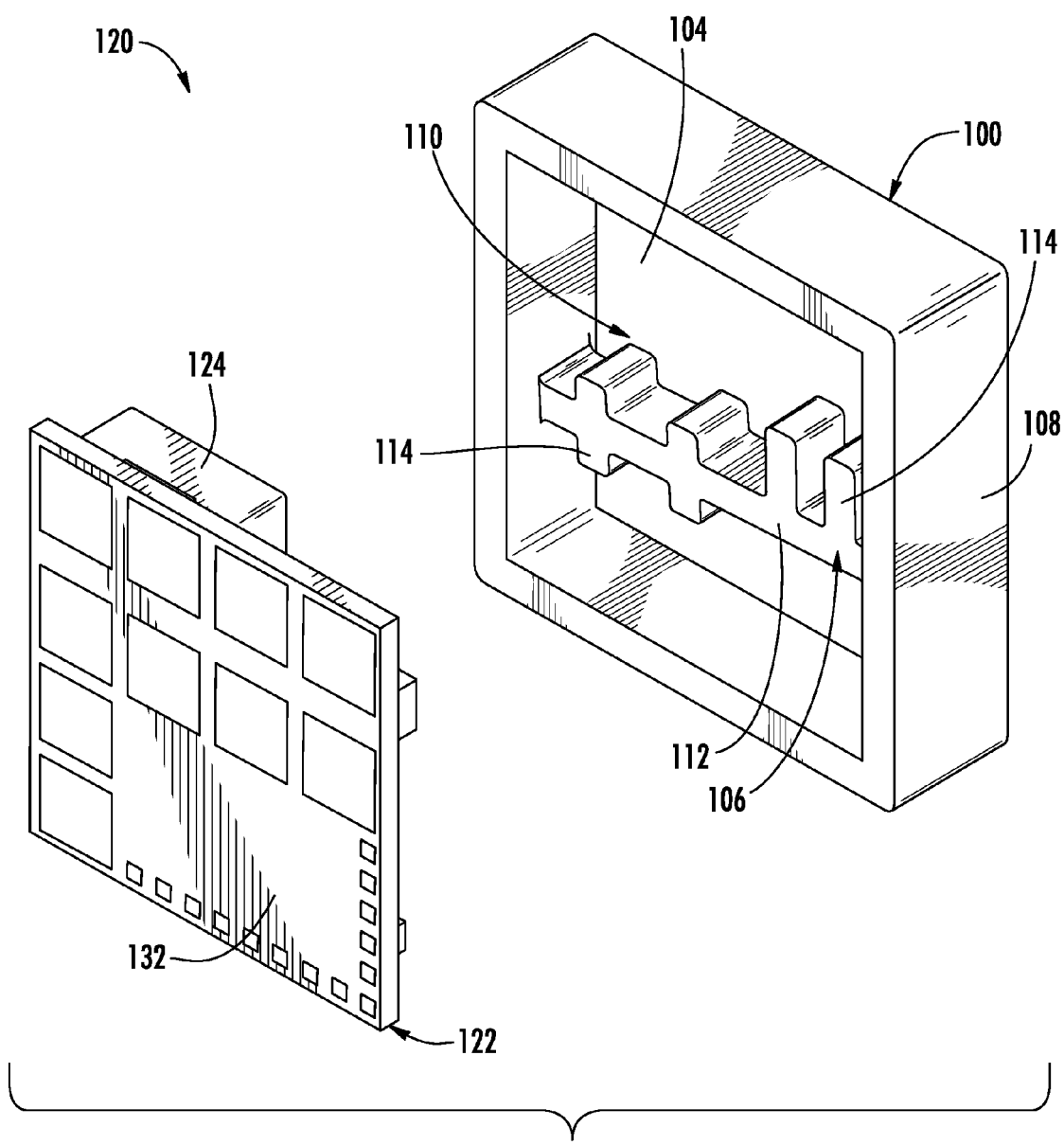
FIG. 6 is a bottom exploded isometric view of the circuit assembly in FIG. 5.
Figure 7:
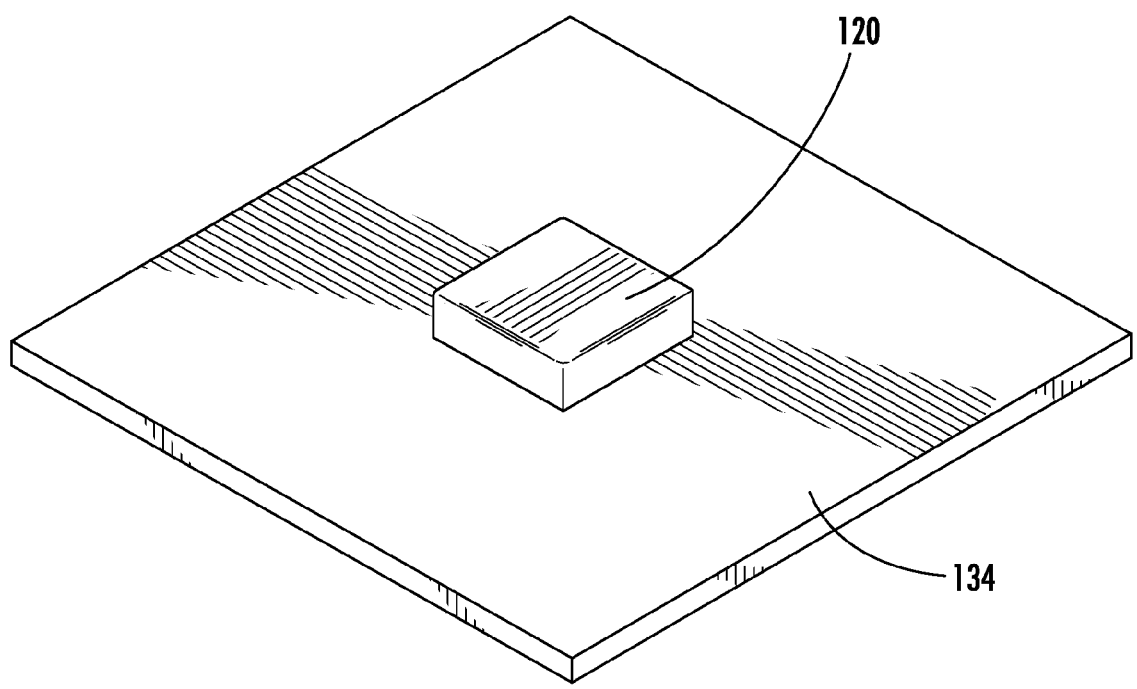
FIG. 7 is a top isometric view of the assembly in FIG. 5 mounted on a system board.
Figure 8:
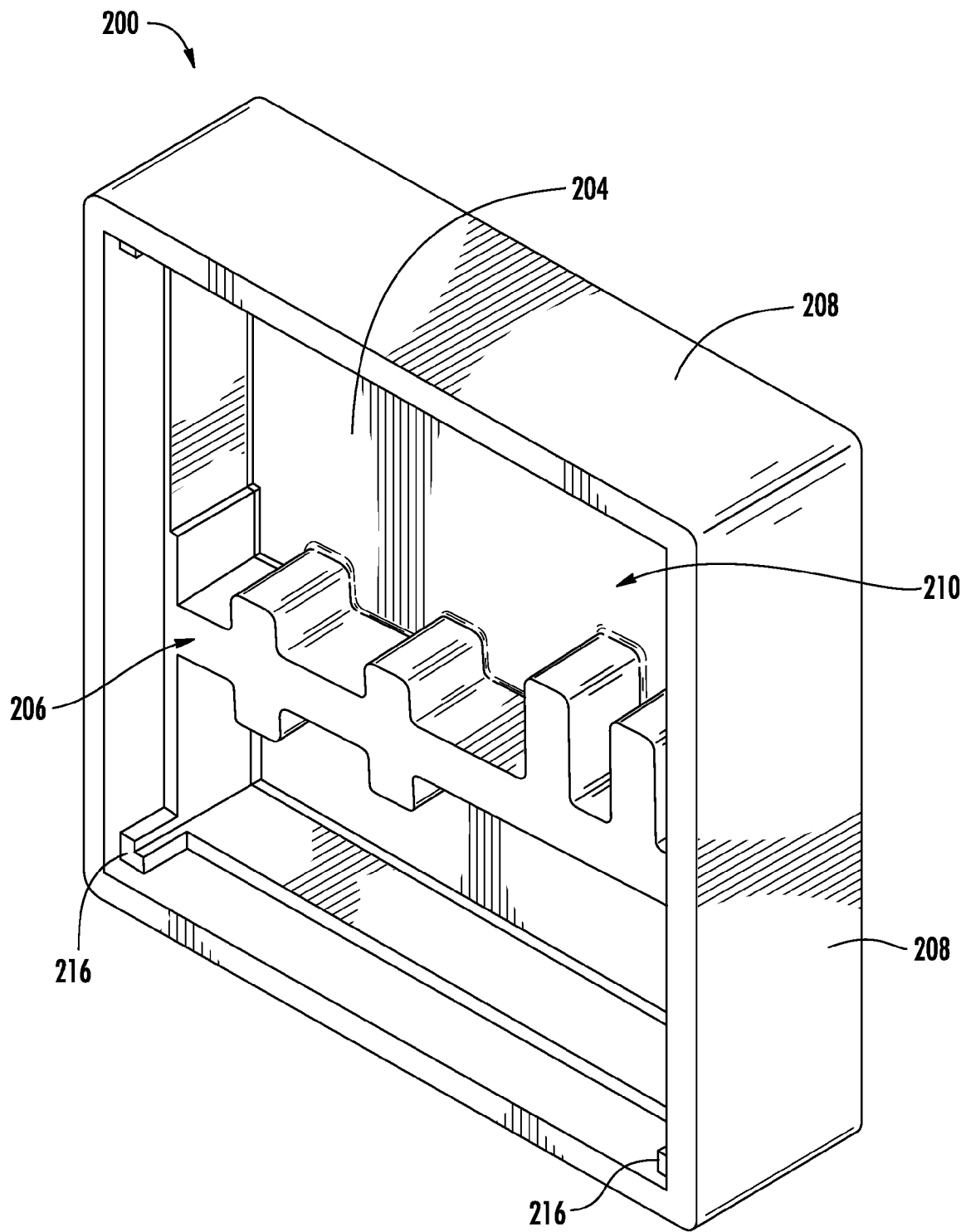
FIG. 8 is a bottom isometric view of another thermally conductive case for a circuit board having heat generating components.
Figure 9:
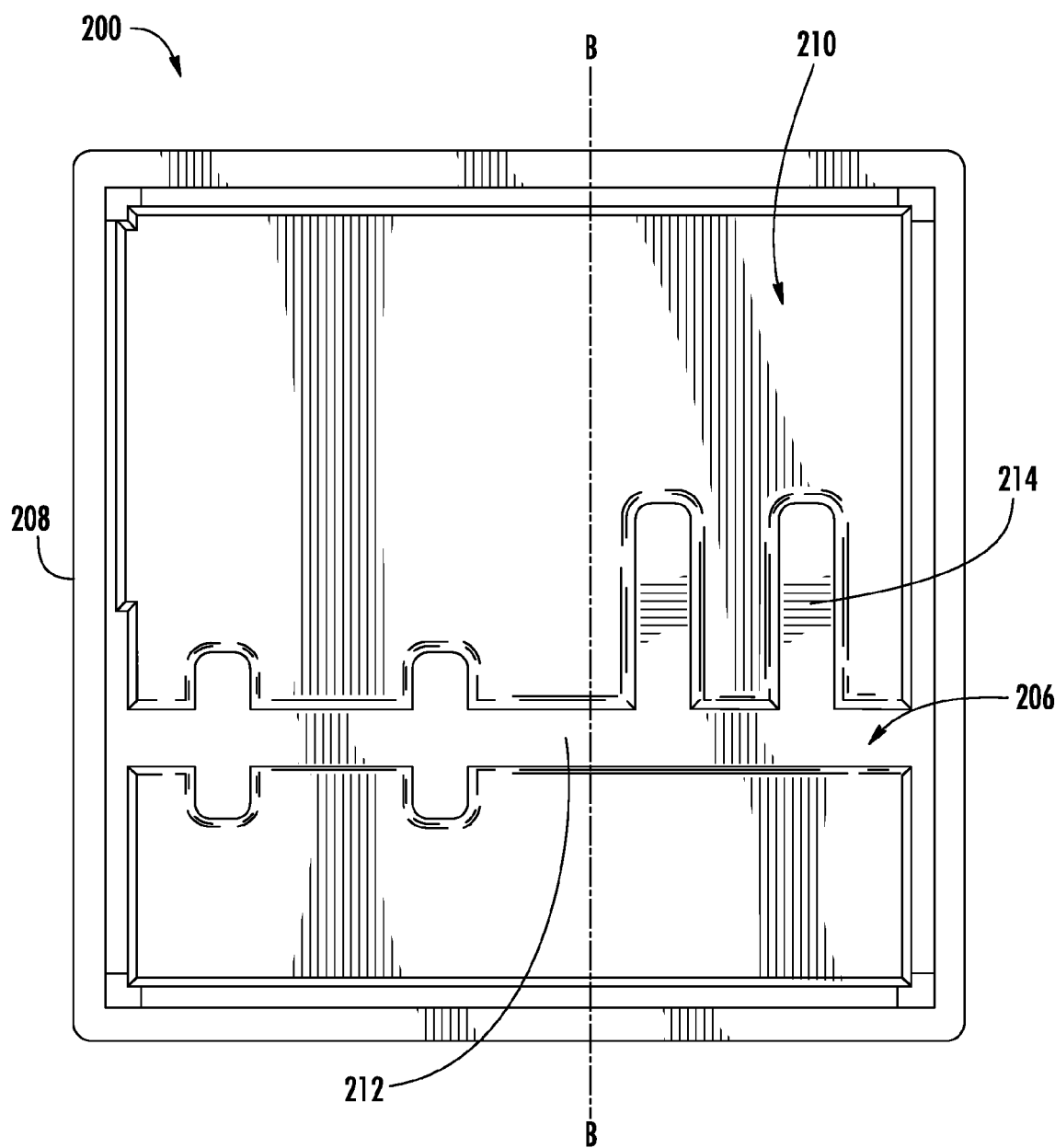
FIG. 9 is a bottom plan view of the case in FIG. 8.
Figure 10:
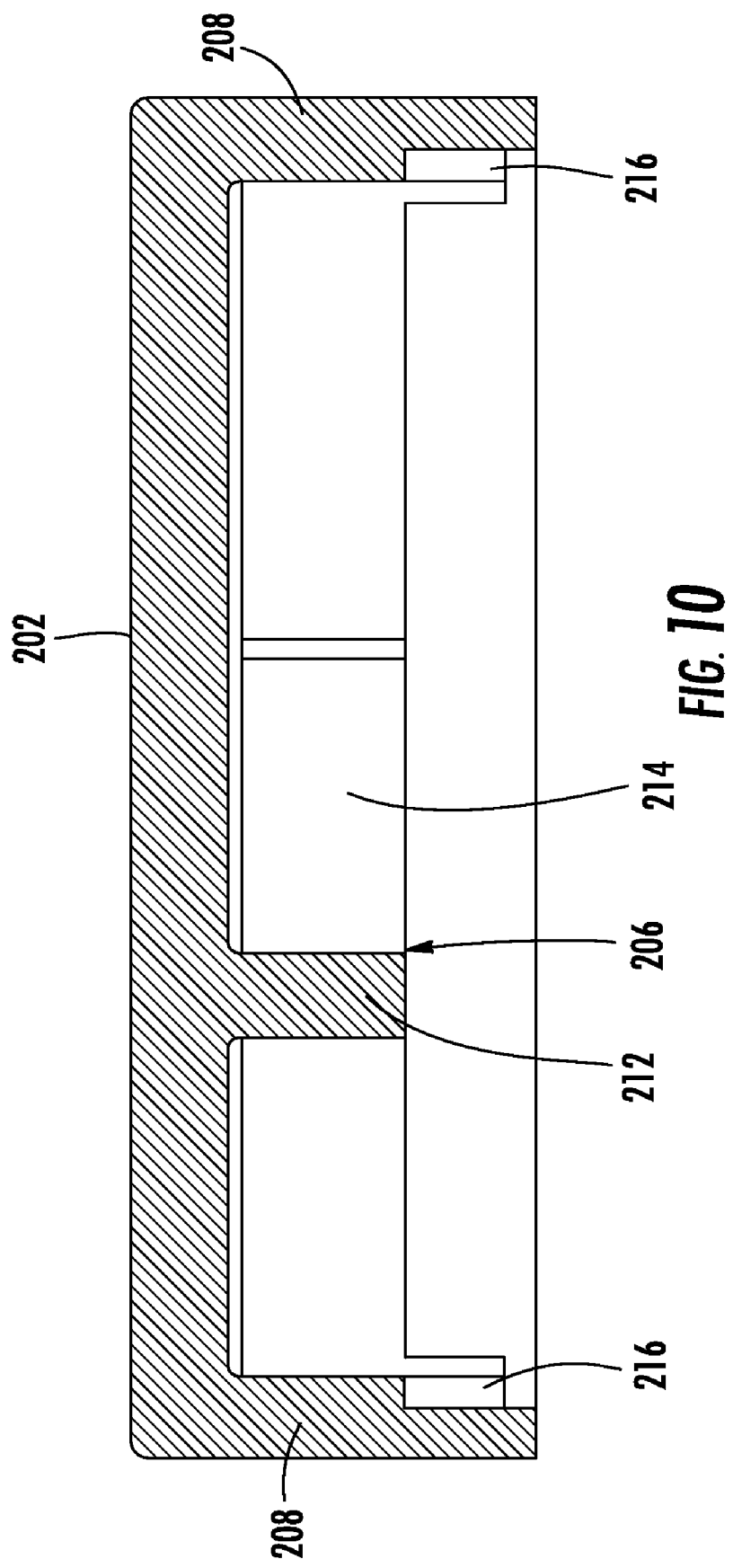
FIG. 10 is a cutaway side view of the case in FIG. 8 cut along the line B-B in FIG. 9.

An electronic circuit assembly 120 including the cover 100 and a circuit 122 is shown in FIGS. 5 and 6. The circuit 122 includes various heat generating components 124, 126, 128, 130 mounted on a circuit board, or PCB, 132. When the cover 100 is installed over the circuit 122 the heat generating components 124-130 are located within the internal cavity 110. Heat generating components 126-130 are located underneath the rib 106, while component 124 is located close to the bottom surface 104. Heat generated by the components 126-130 is transferred away from the components 126-130 and to the thermally conductive cover 100 via the rib 106 and heat generated by the component 124 is transferred away from the component and to the thermally conductive cover 100 via the bottom surface 104. The generated heat is then transferred into the air surrounding the cover 100. Thus, the entire cover 100, is able to act as a large heat sink for the heat generating components 124-130. This transfer of heat away from the components 124-130 limits or eliminates the heat generated by the components 124-130 that is transferred to the circuit board 132 and/or to any board or system, such as a system board 134 in FIG. 7, to which the assembly 120 is attached.

The cover may also allow the heat generating components 124-130 to operate at a lower temperature than they would without the cover 100. The cover 100 acts as a heat sink for heat generating components 124-130 enclosed by the cover. Because most components should only be operated within a specific range of temperatures, the safe operating area, this transfer of heat away from the component 124-130 allows them to be driven harder and/or allows less robust, and hence cheaper, components 124-130 to be used in the circuit 122. For example, in one power supply circuit, using the cover 100 permitted the output current of the power supply circuit to be increased to 20 amps from a maximum of 10 amps without the cover 100.

Figure 4:
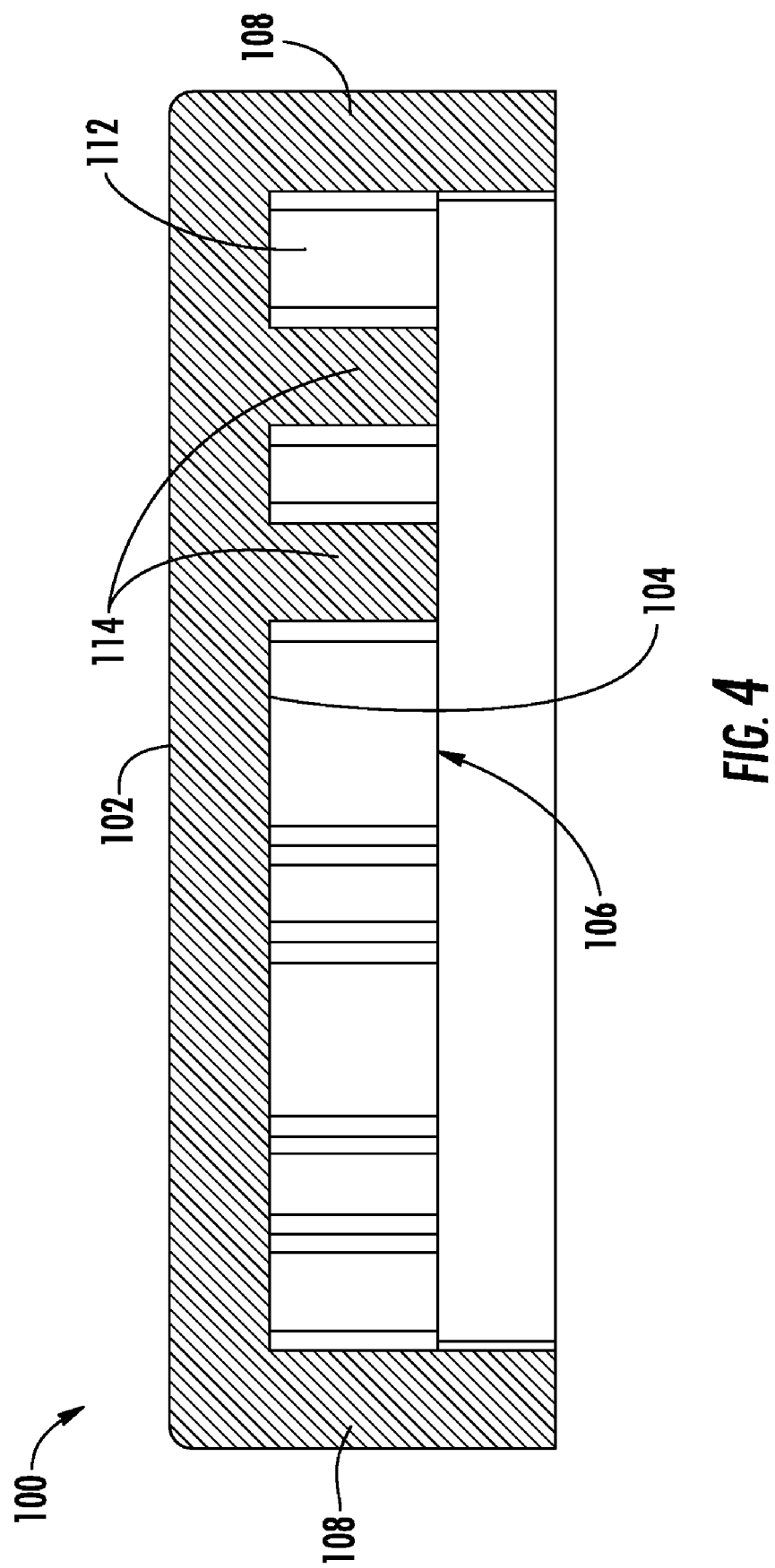
FIG. 4 is a cutaway side view of the case in FIG. 1 cut along the line A-A in FIG. 3.

As can be seen most clearly in FIGS. 1, 4 and 6 the ribs 106 do not extend as far from the top 102 as do the sides 108. This allows room for the components 126-130 to be contained within the internal cavity 110 without significant interference from the rib 106. Although the rib 106 is illustrated as extending a single distance from the top 102, the rib 106 may extend multiple distances or different ribs 106 may extend different distances. Components on the circuit board 132 may be different sizes and heights, and located in different locations around the circuit board. The rib 106 is generally positioned so that it does not come in contact with any components on the circuit board 132 even after the cover 100 is mounted on the circuit board 132. The rib 106 is located such that some of the components mounted on the circuit board 132, such as heat generating component 124, will be housed in portions away from, or beside, the rib 106. Top portions of such components may be in contact with, or be close to, but separated from, the bottom surface 104. With respect to some other components, particularly heat generating components 126-130, the rib 106 is generally oriented so that it extends above and slightly separated from the components 126-130. In some embodiments, the rib 106 may contact one or more heat generating component 126-130. In some embodiments, a thermally conductive material, such as a gel, glue, putty, cream, pad, etc., bridges the gap between the heat generating components 126-130 and the rib 106 and/or the heat generating component 124 and the bottom surface 104.

Figure 3:
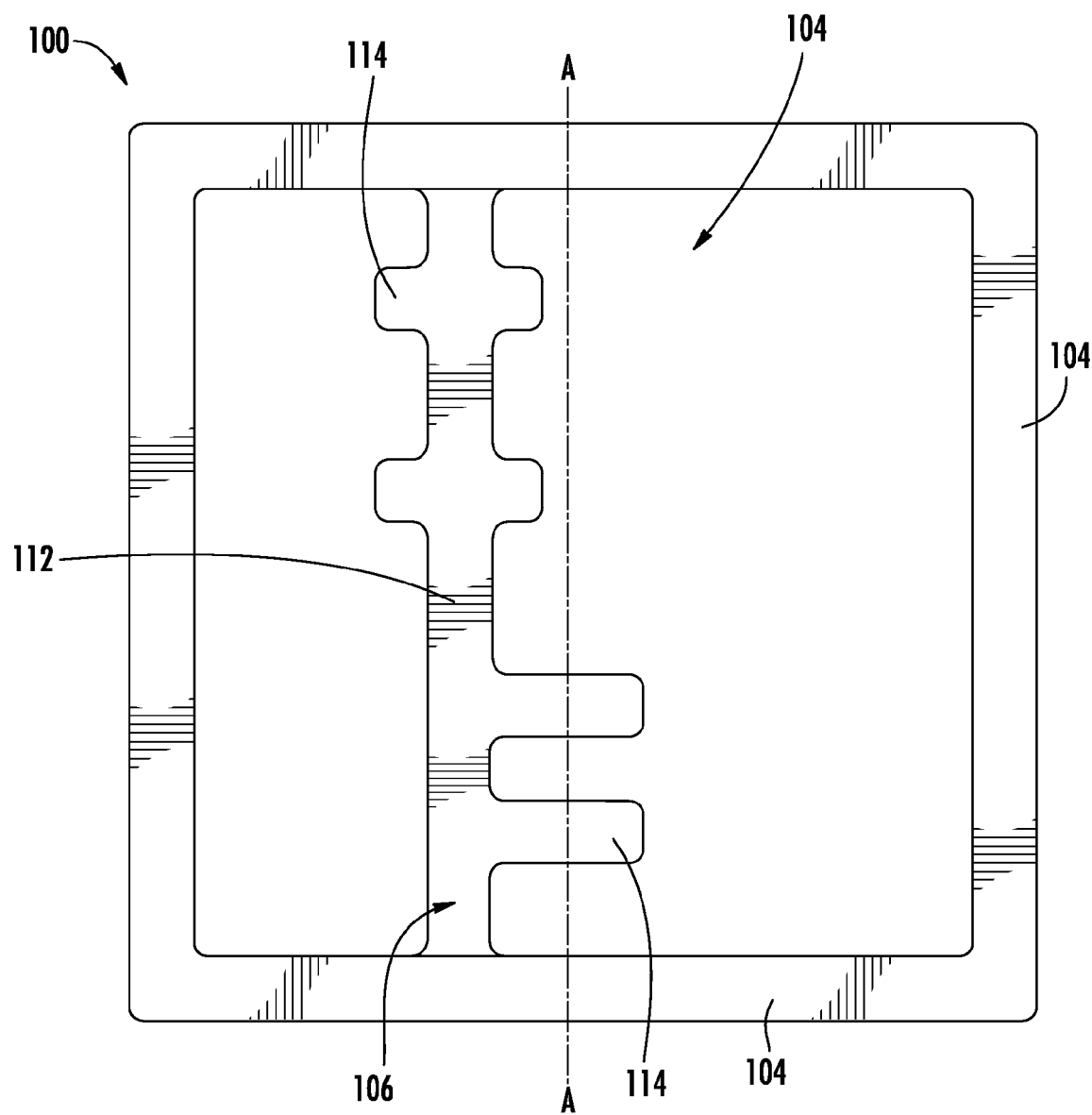
FIG. 3 is a bottom plan view of the case in FIG. 1.

The rib 106 includes a first, or main, portion 112. The first portion 112 extends between, and connects to, two of the sides 108. Several fingers, or second portions 114, extend from the first portion 112. The second portions 114, as illustrated in FIG. 3, extend generally perpendicular from the first portion 112 and are a monolithic part of the rib 106. The second portions 114 extend out to locate at least part of the second portions 114 over heat generating components 126-130 and/or to provide a greater surface area of the rib 106 over the heat generating components 126-130 when the cover 100 is installed over the circuit board 132. Both the main portion 112 and the second portions 114 are approximately the same width as the sides 108 of the case 100. The first portion 112 and the second portions 114 extend approximately the same distance from bottom surface 104, however, the first portion 112 and the second portions 114 may extend different distances from the bottom surface 104. Similarly, the first portion 112 and/or the second portions 114 may extend to multiple distances from the bottom surface, i.e. a second portion 114 or the first portion 112 may itself vary in distance from the bottom surface 104. Varying distances from the bottom surface 104 may be used, for example, when heat generating components of varying heights are included in a circuit with which the cover 100 will be used. Although the embodiments illustrated include second portions 114 extending perpendicular to the first portion 112, the second portions may, additionally or alternatively, extend at an angle greater or less than ninety degrees from the first portion 112. The specific location, shape, thickness, height, orientation, number, etc. of the main portion 112 and the second portions 114 depends upon the specific location of heat generating components on a circuit board with which the cover 100 will be used. Any combination is acceptable so long as it places at least a part of the main portion 112 and/or the second portions 114 over at least some of the heat generating components on a circuit board when the cover 100 is installed over a circuit board. Additionally, more than one rib 106 can be included depending upon the size of the circuit board and the number of heat generating components.

Another example thermally conductive cover 200 for a circuit board having a heat generating component mounted thereon and assemblies including such a cover 200 are illustrated in FIGS. 8-13. The cover 200 is similar to the cover 100. The cover 200 includes a top surface 202, a bottom surface 204, and at least one rib 206 extending downwardly from the bottom surface 204. The cover 200 is configured such that the bottom surface 204 will be spaced above and extend over the top sides of the plurality of heat dissipating components when the cover 200 is placed over the circuit board. The at least one rib 206 is oriented to extend over and be spaced from the plurality of heat dissipating components when the cover 200 is placed over the circuit board.

One difference between the case of FIGS. 8-13 and the case FIGS. 1-7 is evident in the sides 208. Unlike the sides 108, the sides 208 are not a single thickness. The sides 208 and the rib 206 are approximately the same width or thickness near the bottom surface 204. As the sides 208 depend below the bottom of the rib 206, however, the sides 208 become thinner. This allows use with a slightly larger circuit board. Corner blocks 216 create a stop to prevent a circuit board from being inserted to far into the internal cavity 210 the cover 200. This helps prevent the components mounted to a circuit board from contacting the cover 200 within the internal cavity 210.

Figure 11:
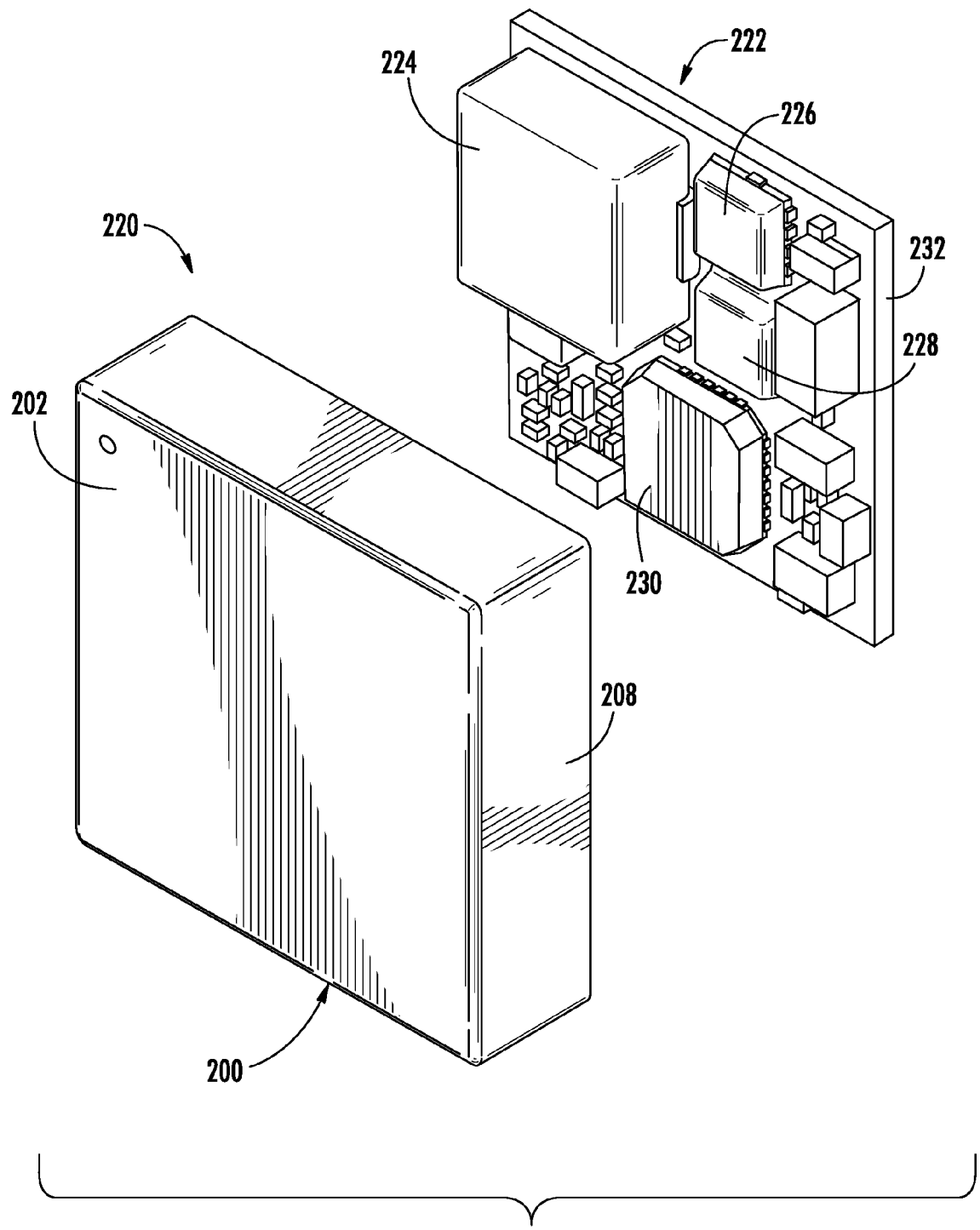
FIG. 11 is a top exploded isometric view of a circuit assembly including the case in FIG. 8.
Figure 12:
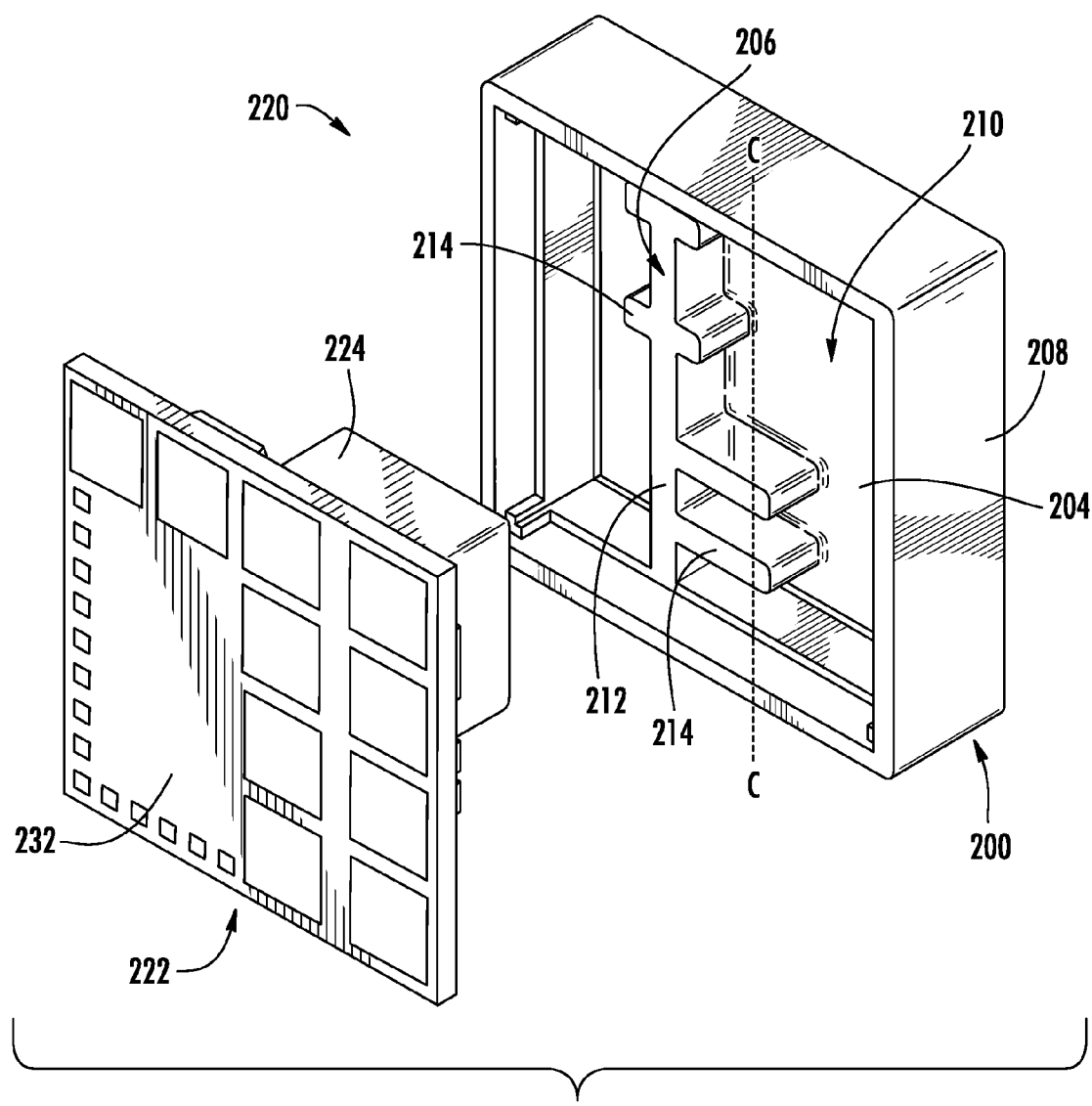
FIG. 12 is a bottom exploded isometric view of the circuit assembly in FIG. 11.
Figure 13:
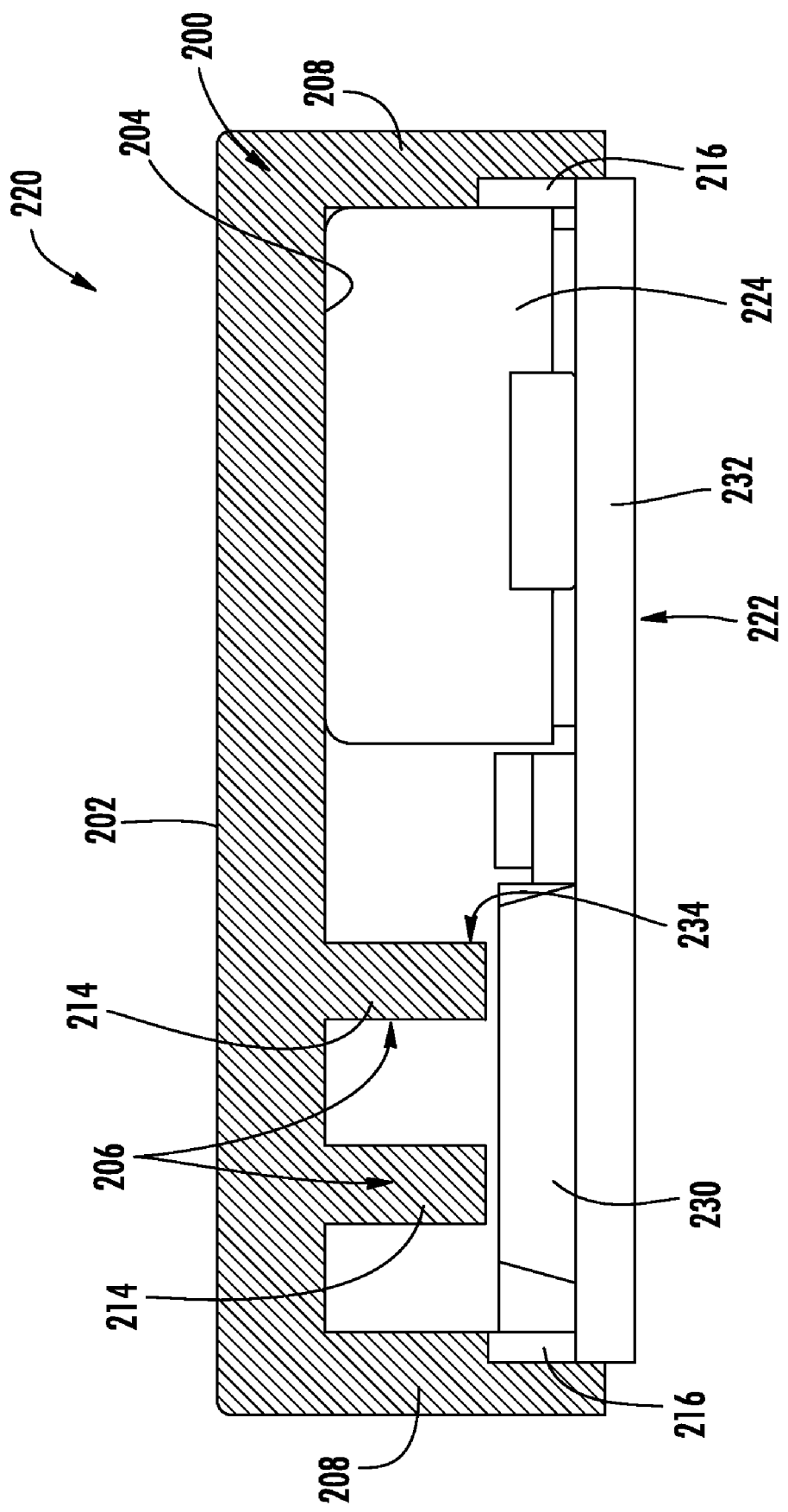
FIG. 13 is a cutaway side view of the circuit assembly in FIG. 11 cut along the line C-C in FIG. 12.

An electronic circuit assembly 220 including the cover 200 and a circuit 222 is shown in FIGS. 11-13. The circuit 222 includes various heat generating components 224, 226, 228, 230 mounted on a circuit board, or PCB, 232. When the cover 200 is installed over the circuit 222, the heat generating components 224-230 are located within the internal cavity 210. Heat generating components 226-230 are located underneath the rib 206, while component 224 is located close to the bottom surface 204. Heat generated by the components 226-230 is transferred away from the components 226-230 and to the thermally conductive cover 200 via the rib 206 and heat generated by the component 224 is transferred away from the component 224 and to the thermally conductive cover 200 via the bottom surface 204. The generated heat is then transferred into the air surrounding the cover 200. Thus, the entire cover 100, is able to act as a large heat sink for the heat generating components 224-230.

As can be seen in FIG. 13, the circuit board 232 rests against the stops 216. The cover 200 is thus prevented from being lowered any further over the circuit board 232. A gap 234 exists between the heat generating component 230 and the rib 206. This gap 234 can be filled with a thermally conductive material, as discussed above, to ensure thermal contact between the component 230 and the rib 206. The heat generating component 224 may contact the bottom surface 204 or there may be a gap between a top of the component 224 and the bottom surface 204. In either case, a thermally conductive material, as discussed above, may be used to ensure thermal contact between the component 224 and the bottom surface 204.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed:

1. An electronic circuit assembly comprising:
   a plurality of heat dissipating components, each component having a top side; and
   a thermally conductive cover having a top surface, a bottom surface, and at least one rib extending downwardly from the bottom surface, the bottom surface spaced above and extending over the top sides of the plurality of heat dissipating components, the at least one rib extending over and thermally coupled to the top side of at least one of the plurality of heat dissipating components for conductive transfer of heat from said at least one of the plurality of heat dissipating components to the at least one rib.

2. The assembly of claim 1 further comprising a circuit board supporting the plurality of heat dissipating components.

3. The assembly of claim 2 wherein the at least one rib is spaced from the circuit board.

4. The assembly of claim 2 wherein the circuit board has a top side and the bottom surface of the thermally conductive cover extends over an entirety of the circuit board's top side.

5. The assembly of claim 4 wherein the circuit board includes a plurality of side edges, the thermally conductive cover includes a plurality of sides extending downwardly from the top surface, and the plurality of sides extend around and cover the plurality of side edges.

6. The assembly of claim 2 wherein the electronic circuit assembly is a power supply module configured to produce an output current or voltage from an input current or voltage.

7. The assembly of claim 6 wherein the plurality of heat dissipating components include an inductor, a transistor, and a controller for the transistor.

8. The assembly of claim 2 wherein the rib includes at least a first portion extending above and thermally coupled to the top side of a first one of the plurality of heat dissipating components and a second portion extending above and thermally coupled to the top side of a second one of the plurality of heat dissipating components.

9. The assembly of claim 2 wherein the thermally conductive cover is made of a polymer resin.

10. The assembly of claim 9 wherein the polymer resin includes a thermally conductive filler.

11. The case of claim 9 wherein the polymer resin is polyplenylene sulfide.

12. The assembly of claim 1 wherein the top surface of the thermally conductive cover is substantially planar.

13. The assembly of claim 1 wherein the at least one rib directly contacts the top side of said at least one of the plurality of heat dissipating components.

14. The assembly of claim 1 further comprising a thermally conductive material positioned between and contacting the at least one rib and the top side of said at least one of the plurality of heat dissipating components.

15. The assembly of claim 2 wherein the thermally conductive cover is mounted to the circuit board.

16. A method of producing a thermally conductive cover for an electric circuit assembly having a plurality of heat dissipating components, the thermally conductive cover including a top surface, a bottom surface, and at least one rib extending downwardly from the bottom surface, the method comprising:
   selecting a plurality of dimensions for the thermally conductive cover such that the bottom surface will be spaced above and extend over top sides of the plurality of heat dissipating components and the at least one rib will extend over and be thermally coupled with a top side of at least one of the plurality of heat dissipating components when the thermally conductive cover is installed over the electronic circuit assembly to conductively transfer heat from said at least one of the plurality of heat dissipating components to the at least one rib; and
   producing the thermally conductive cover with the selected dimensions.

17. The method of claim 16 wherein the thermally conductive cover is made of a polymer resin.

18. The method of claim 17 wherein producing the thermally conductive cover includes producing the thermally conductive cover by injection molding.

19. The method of claim 17 wherein the polymer resin includes a thermally conductive filler.

20. In a method of using a power supply module including producing a first maximum output current, the first maximum output current being thermally limited due to one or more heat dissipating components in the power supply module, the improvement comprising:
   installing a thermally conductive cover over the power supply module, the thermally conductive cover including a bottom surface extending over and thermally coupled to top sides of the one or more heat dissipating components for conductive transfer of heat from the one or more heat dissipating components to the thermally conductive cover; and
   producing a second maximum output current that is greater than the first maximum output current with the thermally conductive cover installed over the power supply module.

21. The method of claim 20 wherein the first maximum output current is about 10 amperes and the second maximum output current is about 20 amperes.

22. The method of claim 20 wherein the thermally conductive cover includes at least one rib extending downwardly from the bottom surface, and over the one or more heat dissipating components, the at least one rib thermally coupled to said one or more heat dissipating components to conductively transfer heat from said one or more heat dissipating components to the at least one rib.

23. The method of claim 22 wherein the thermally conductive cover is made of a polymer resin including a thermally conductive filler.

24. The method of claim 22 wherein the at least one rib includes at least a first portion extending above and thermally coupled to a first heat dissipating component of the one or more heat dissipating components and a second portion extending above and thermally coupled to a second heat dissipating component of the one or more heat dissipating components.

* * * * *

UNITED STATES PATENT AND TRADEMARK OFFICE
CERTIFICATE OF CORRECTION

| | | |
|---|---|---|
| PATENT NO. | : 7,778,033 B2 | Page 1 of 1 |
| APPLICATION NO. | : 12/261803 | |
| DATED | : August 17, 2010 | |
| INVENTOR(S) | : Matthew D. Kretman | |

It is certified that error appears in the above-identified patent and that said Letters Patent is hereby corrected as shown below:

On the Title page, at identifier (75) replace "Maplewood, MO" with "Maplewood, MN".

In the Detailed Description:

At column 6, line 2, replace "the second portions" with "the second portions 114".

At column 6, line 37, replace "to far into the internal cavity 210 the cover 200" with "too far into the internal cavity 210 of the cover 200".

At column 6, line 54, replace "100" with "200".

Signed and Sealed this

Nineteenth Day of October, 2010

David J. Kappos
*Director of the United States Patent and Trademark Office*